(12) United States Patent
Liu et al.

(10) Patent No.: US 10,035,723 B2
(45) Date of Patent: Jul. 31, 2018

(54) GLASS HOUSING, MANUFACTURING EQUIPMENT AND METHOD THEREOF

(71) Applicants: SHENZHEN O-FILM TECH. CO., LTD., Shenzhen (CN); NANCHANG O-FILM OPTICAL TECHNOLOGY CO., LTD., Nanchang (CN)

(72) Inventors: Wei Liu, Nanchang (CN); Genchu Tang, Nanchang (CN); Bin Tang, Nanchang (CN)

(73) Assignees: SHENZHEN O-FILM TECH CO., LTD., Shenzhen (CN); NANCHANG O-FILM OPTICAL TECHNOLOGY CO., LTD., Nanchang (CN)

( * ) Notice: Subject to any disclaimer, the term of this patent is extended or adjusted under 35 U.S.C. 154(b) by 0 days.

(21) Appl. No.: 15/452,726

(22) Filed: Mar. 7, 2017

(65) Prior Publication Data
US 2018/0037488 A1 Feb. 8, 2018

(30) Foreign Application Priority Data

Aug. 3, 2016 (CN) .......................... 2016 1 0628874

(51) Int. Cl.
| | |
|---|---|
| A47B 81/00 | (2006.01) |
| C03B 23/03 | (2006.01) |
| C03C 19/00 | (2006.01) |
| C03C 21/00 | (2006.01) |
| C03C 17/00 | (2006.01) |
| H05K 5/02 | (2006.01) |
| H05K 5/00 | (2006.01) |
| G06F 1/16 | (2006.01) |

(Continued)

(52) U.S. Cl.
CPC ...... *C03B 23/0302* (2013.01); *C03B 23/0307* (2013.01); *C03C 17/002* (2013.01); *C03C 19/00* (2013.01); *C03C 21/002* (2013.01); *G06F 1/1626* (2013.01); *H05K 5/0086* (2013.01); *H05K 5/0243* (2013.01); *C03C 2217/73* (2013.01); *C03C 2217/76* (2013.01); *C03C 2218/151* (2013.01); *C03C 2218/154* (2013.01); *H04B 1/3888* (2013.01); *H04M 1/026* (2013.01)

(58) Field of Classification Search
CPC ....................................................... G06F 1/181
USPC .......................................... 312/223.1, 223.2
See application file for complete search history.

(56) References Cited

U.S. PATENT DOCUMENTS

| | | | | |
|---|---|---|---|---|
| 6,030,088 A | * | 2/2000 | Scheinberg | ........... G06F 1/1601 312/223.2 |
| 6,352,322 B1 | * | 3/2002 | Nakao | ............... G02F 1/133308 312/223.1 |

(Continued)

*Primary Examiner* — Matthew W Ing
(74) *Attorney, Agent, or Firm* — Platinum Intellectual Property LLP (57) ABSTRACT

A glass housing includes an inner surface; an outer surface opposite to the inner surface; and a circumferential surface interconnecting the outer surface and the inner surface, wherein a distance between the inner surface and the outer surface ranges from 0.2 mm to 1 mm, each of the inner surface and the outer surface includes a planar portion and two curved portions extending outwardly from opposite edges of the planar portion toward a side of the inner surface, the curved portion is an arc surface having a radius of curvature ranging from 5 mm to 50 mm. The present disclosure further provides a manufacturing device and manufacturing method of manufacturing the glass housing.

20 Claims, 9 Drawing Sheets

(51) Int. Cl.
*H04M 1/02* (2006.01)
*H04B 1/3888* (2015.01)

(56) References Cited

U.S. PATENT DOCUMENTS

| | | | | |
|---|---|---|---|---|
| 7,464,814 | B2 * | 12/2008 | Carnevali | G06F 1/1626 |
| | | | | 206/320 |
| 2013/0021280 | A1 * | 1/2013 | Dabov | G06F 1/1626 |
| | | | | 345/173 |
| 2013/0069502 | A1 * | 3/2013 | Hu | B29C 45/14467 |
| | | | | 312/223.1 |
| 2013/0335899 | A1 * | 12/2013 | Wang | H04M 1/0249 |
| | | | | 361/679.01 |
| 2015/0016036 | A1 * | 1/2015 | Morioka | H04M 1/0266 |
| | | | | 361/679.3 |
| 2015/0049433 | A1 * | 2/2015 | Berg | B29C 45/14 |
| | | | | 361/679.55 |
| 2015/0061477 | A1 * | 3/2015 | Wilson | H04B 1/3888 |
| | | | | 312/223.1 |
| 2015/0062787 | A1 * | 3/2015 | Wilson | H04M 1/185 |
| | | | | 361/679.01 |

* cited by examiner

GLASS HOUSING, MANUFACTURING EQUIPMENT AND METHOD THEREOF

FIELD OF THE INVENTION

This application claims priority under 35 U.S.C. § 119 to Chinese Patent Application Nos. 201610628874.0, filed on Aug. 3, 2016. The entire teachings of the above application are incorporated herein by reference.

The present disclosure relates to electronic devices, and more particularly, relates to a glass housing, a manufacturing equipment and method of manufacturing the glass housing.

BACKGROUND OF THE INVENTION

With the development of electronic devices such as smart phone and smart watch, which are provided with a touch screen, various manufacturers scramble to launch differentiated devices, hoping to attract the consumers. A highlight design emerging in the current market is that, the housing of the electronic device is configured to be a curved housing. The electronic device having a curved housing can fit the hand of the user better, providing a comfortable sensation for holding and handling the electronic device. If the watch housing is configured to be a curved housing, it can fit the wrist of the user better, thereby providing a comfortable sensation for wearing the watch. Furthermore, when a display housing having the curved configuration, the displaying content displayed on the display can have an intense stereoscopic impression, and a perception can thereby be improved. Because glass has a better tactile sensation, when it serves as the materials of the housing of the electronic device, the electronic device meets a great favor. However, when the glass housing of the electronic device is configured to be a convex curved housing, it cracks easily when falls by an accident.

SUMMARY

Accordingly, it is necessary to provide a glass housing having a dispersed stress and a high strength, a manufacturing equipment and a manufacturing method of manufacturing the glass housing.

A glass housing includes an inner surface; an outer surface opposite to the inner surface; and a circumferential surface interconnecting the outer surface and the inner surface, wherein a distance between the inner surface and the outer surface ranges from 0.2 mm to 1 mm, each of the inner surface and the outer surface includes a planar portion and two curved portions extending outwardly from opposite edges of the planar portion toward a side of the inner surface, the curved portion is an arc surface having a radius of curvature ranging from 5 mm to 50 mm.

A manufacturing equipment of manufacturing aforementioned glass housing includes: a sealing chamber, and an upper die and a lower die located in the sealing chamber, wherein the upper die includes an upper flat press portion and an upper curved portion separated from the upper flat press portion, the lower die includes a lower flat press portion and a lower curved portion separated from the lower flat press portion, the upper flat press portion and the lower flat press portion are configured to clamp a planar portion of the glass housing, the upper curved portion and the lower curved portion have arc surfaces facing each other, and the arc surface has a radius of curvature ranging from 1 mm to 50 mm, the upper curved portion engages the lower curved portion to form a curved portion of the glass housing.

A manufacturing method of manufacturing aforementioned glass housing includes: cutting a master-slice glass having a thickness ranging from 0.2 mm to 1 mm to divide the master-slice glass into a plurality of sub-slice glasses which meet a size requirement of a glass housing; performing a CNC machining to the sub-slice glass, causing the sub-slice glass to have a required dimension; grinding the machined sub-slice glass to remove scratch and microcracks on a surface of the machined sub-sliced glass; pressing step: clamping and positioning a middle portion of the sub-slice glass, and pressing and bending opposite edges of the sub-slice glass to form arc surfaces, the arc surface having a radius of curvature ranging from 5 mm to 50 mm; and immersing the pressed sub-slice glass into alkali metal molten salt to form a compressive stress layer on the sub-slice glass.

By aforementioned configuration of the structural parameters, the concentrated stress applied to the glass housing is dispersed, an integral strength of the glass housing is enhanced. The risk that cracks emerge easily by a slight collision due to the concentrated stress is reduced.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE EMBODIMENTS

Embodiments of the invention are described more fully hereinafter with reference to the accompanying drawings, in which preferred embodiments of the invention are shown. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

As shown in FIG. 1 through FIG. 4, a glass housing 100 is provided according to one embodiment, which can be applied to electronic devices such as a smart phone or a smart watch. The glass housing can serve as a display housing of the phone or the watch, or it can also serve as a back cover plate of the phone or the watch.

The glass housing includes an inner surface 101, an outer surface 102 opposite to the inner surface 101, and a circumferential surface 103 interconnecting the outer surface 102 and the inner surface 101.

The inner surface 101 includes a planar portion 111 and two curved portions 121. The two curved portions 121 are bended and extend outwardly from opposite edges of the planar portion 111 towards a side, respectively. The two curved portions 121 are symmetrically arranged with respect to the planar portion 111. The curved portion 121 has an arced shape cross-section. Radiuses of curvature of the two curved portions 121 can be the same, or can be different. In the illustrated embodiment, the radiuses of curvature of the two curved portions 121 are the same. The radiuses of curvature of the two curved portions 121 ranges from 1 mm to 50 mm, and in an alternative embodiment, the radiuses of curvature range from 5 mm to 20 mm. In an alternative embodiment, the radiuses of curvature range from 5 mm to 10 mm. The smaller the radius of curvature, the steep the arc surface, thus the formed glass housing has an appearance with an impact 3D (third dimensional) visualized effect.

The outer surface 102 also includes a planar portion 112 and two curved portions 122. The two curved portions 121 are bended and extend outwardly from opposite edges of the planar portion 111 towards the same side, respectively. The curved portions 122 of the outer surface 102 and the curved portions 121 of the inner surface 101 are bended towards the same side, i.e. the curved portions 122 and the curved portions 121 are bended toward the inner surface 101. The two curved portions 122 are symmetrically arranged with respect to the planar portion 112. The curved portion 122 has an arced shape cross-section. Radiuses of curvature of the two curved portions 122 can be the same, or can be different. In the illustrated embodiment, the radiuses of curvature of the two curved portions 122 are the same. The radiuses of curvature of the two curved portions 122 range from 1 mm to 50 mm, and in an alternative embodiment, the radiuses of curvature range from 5 mm to 20 mm. In an alternative embodiment, the radiuses of curvature range from 5 mm to 10 mm.

The planar portion 112 has a position corresponding to a position of the planar portion 111, and the planar portion 112 has the same size as that of the planar portion 111, thus when the outer surface 102 of the glass housing of the electronic device is placed upon a horizontal plane, a projection of the planar portion 111 and a projection of the planar portion 112 are completely overlapped.

Figure 4:
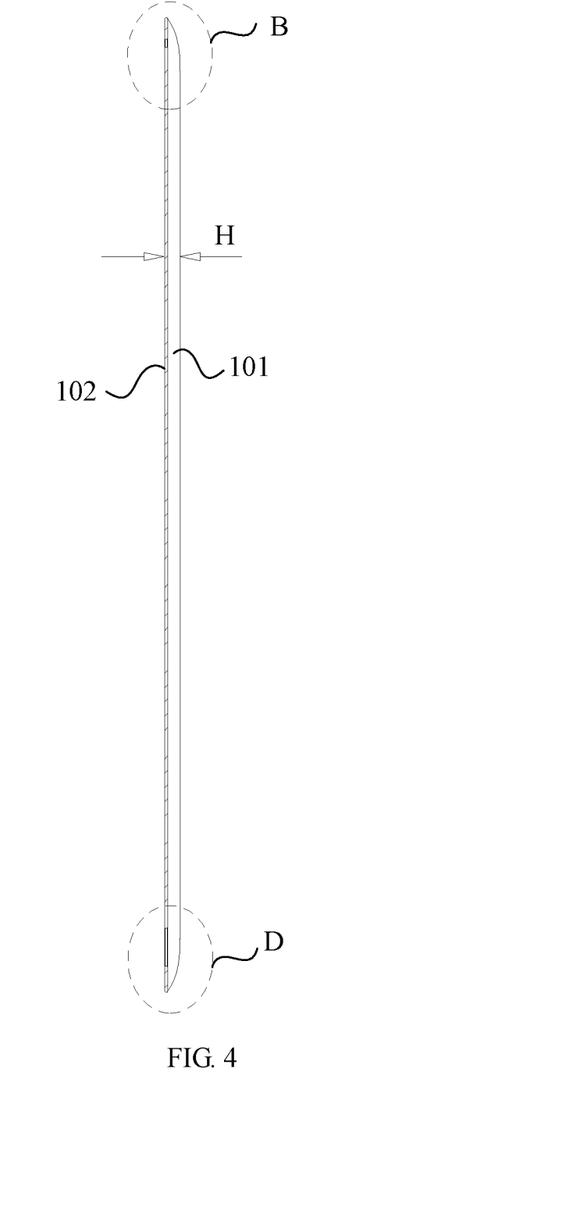
FIG. 4 is a cross-sectional view taken along line A-A of FIG. 2.

Specifically, a radius of curvature the curved portion 122 is equal to a radius of curvature of the curved portion 121. In the illustrated embodiment, a distance between the inner surface 101 and the outer surface 102 ranges from 0.2 mm to 1 mm, i.e. the glass housing has a thickness ranging from 0.2 mm to 1 mm. The glass housing has an uniform thickness, thereby the stress concentration can be better eliminated, and the integral structure strength can be improved. In an alternative embodiment, the glass housing has a thickness ranging from 0.5 mm to 0.7 mm.

Figure 1:
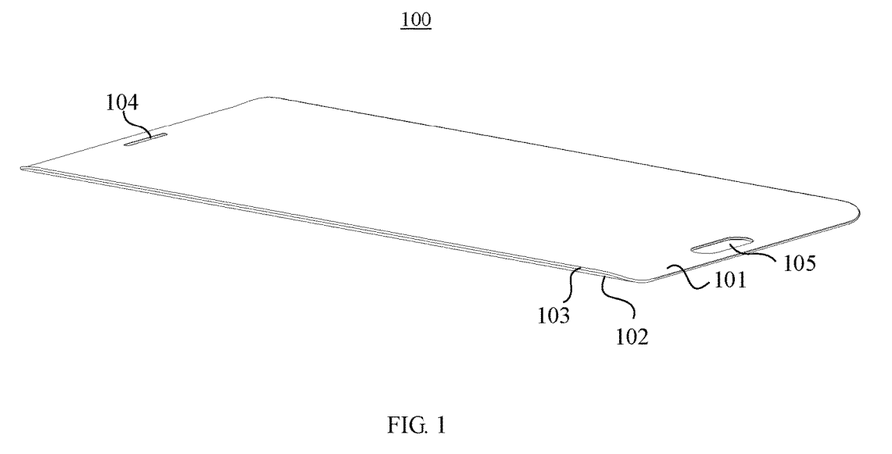
FIG. 1 is a perspective view of a glass housing according to an embodiment.
Figure 2:
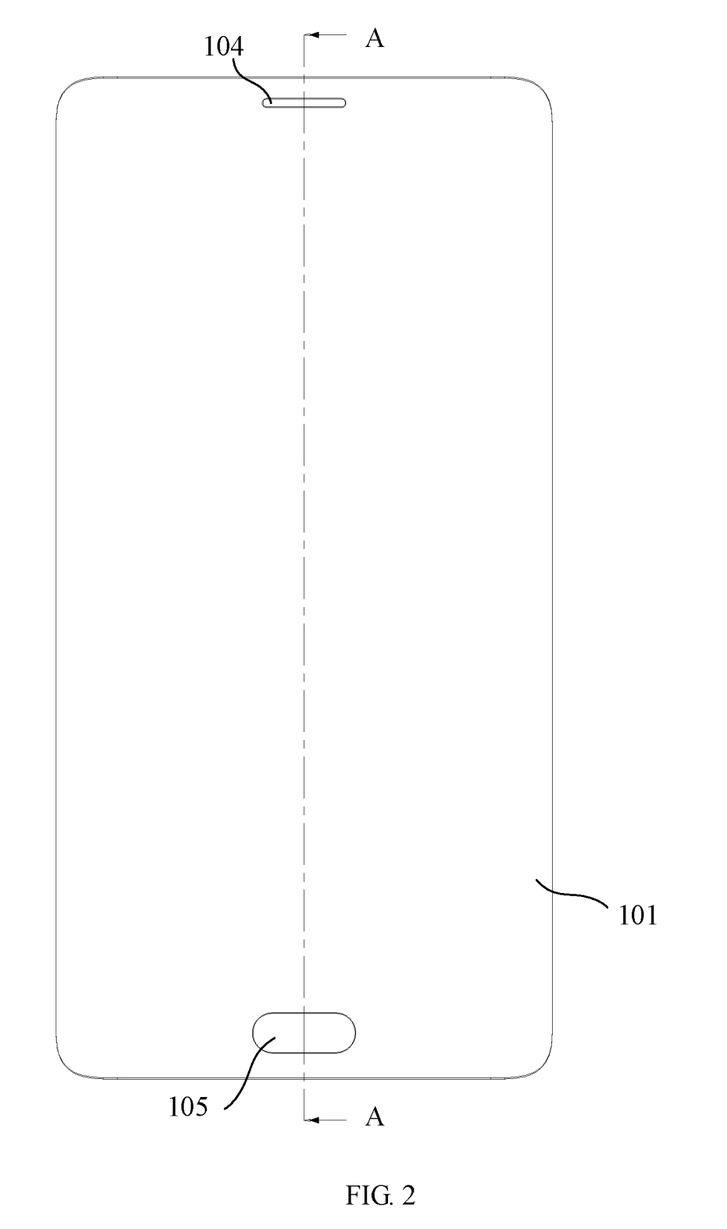
FIG. 2 is a top view of the glass housing of FIG. 1.
Figure 3:
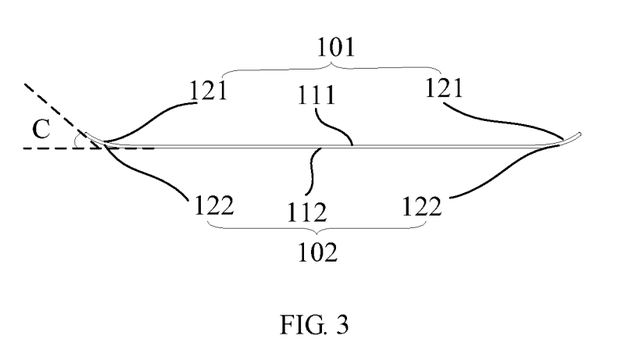
FIG. 3 is an end view of the glass housing of FIG. 2.

Referring to FIG. 3, a tangent line which passes a point on an edge of an arc of the curved portion 122 and the planar portion 112 define an angle C, 0°<C<90°, and in an alternative embodiment, 0°<C<45°. An angle C defined by the curved portion 121 and the planar portion 111 can have a same value as the angle C defined by the curved portion 122 and the planar portion 121.

Further, a distance between the point on the edge of the arc of the curved portion 122 and the planar portion 112 ranges from 0.5 mm to 5 mm, i.e. a height of the glass housing ranges from 0.5 mm to 5 mm.

In some alternative embodiments, an orthographic projection of the glass housing on the horizontal plane is a rectangle, a length of the rectangle ranges from 50 mm to 500 mm, and a width of the rectangle ranges from 30 mm to 300 mm. The curved portions 121, 122 are arranged on two edges of a longitudinal direction of the rectangle.

Figure 5:
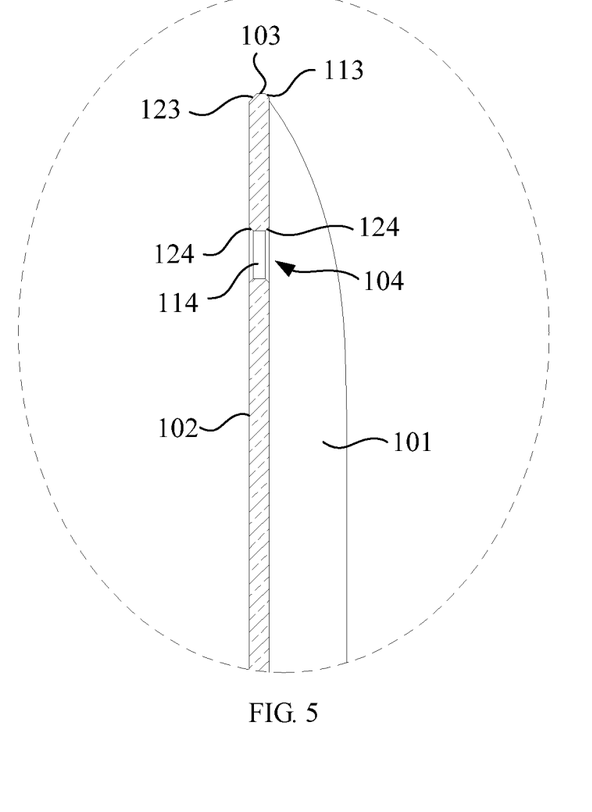
FIG. 5 is an enlarged view of circled portion B of FIG. 4.
Figure 6:
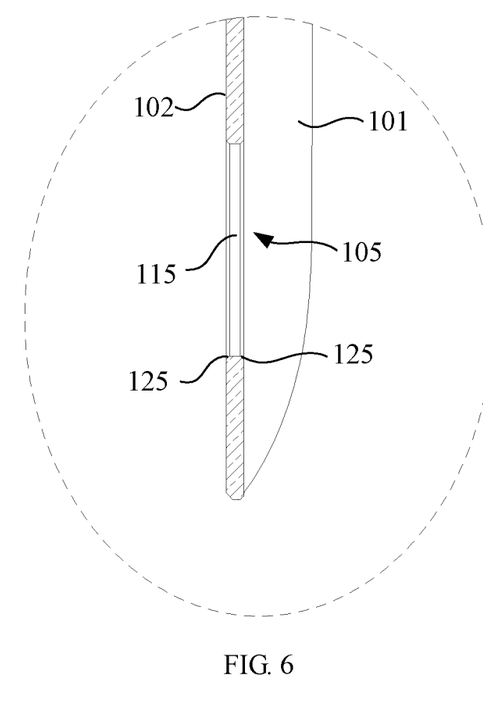
FIG. 6 is an enlarged view of circled portion D of FIG. 4.

Also referring to FIG. 5 and FIG. 6, in some alternative embodiments, the glass housing further defines a first through hole 104 and a second through hole 105 which extending through the inner surface 101 and the outer surface 102. Both the first though hole 104 and the second through hole 105 are elongated holes, and each has two arced shape ends. The first through hole 104 has a size less than a size of the second through hole 105. Viewed from FIG. 2, the first through hole 104 is adjacent to an upper end of the glass housing, the second through hole 105 is adjacent to a lower end of the glass housing. In an practical application, the first through hole 104 can serve as a through hole of a speaker or a viewing aperture of a camera. The second through hole 105 can serve as a though hole for mounting a touch control button. Both the first through hole 104 and the second through hole 105 are arranged on a central axis of the glass housing. More specifically, the inner surface 101 and the outer surface 102 each has a central axis, the inner surface 101 is symmetrically arranged along the central axis of the inner surface 101, and the outer surface 102 is symmetrically arranged along the central axis of the outer surface 102. Orthographic projection of a geometric centre of the first through hole 104 and orthographic projection of a geometric centre of the second through hole 105 fall on the central axis of the inner surface 101 or the outer surface 102.

Further, a connecting portion which joins the inner surface 101 and the circumferential surface 103 forms a first arc chamfer 113, i.e. the first arc chamfer 113 is formed between the inner surface 101 and the circumferential surface 103. A connecting portion which joins the outer surface 102 and the circumferential surface 103 forms a second arc chamfer 123, i.e. the second arc chamfer 123 is formed between the outer surface 102 and the circumferential surface 103. A radius of curvature the second arc chamfer 123 is twice of a radius of curvature of the first arc chamfer 113. In an alternative embodiment, the radius of curvature of the first arc chamfer 113 is 0.1±0.05 mm, and the radius of curvature of the first arc chamfer 123 is 0.2±0.05 mm.

Further, a connecting portion which joins a sidewall 114 of the first through hole 104 and the inner surface 101 forms an arc chamfer 124. A connecting portion which joins the sidewall 114 of the first through hole 104 and the outer surface 102 forms an arc chamfer 124. A connecting portion which joins a sidewall 115 of the second through hole 105 and the inner surface 101 forms an arc chamfer 125, and a connecting portion which joins the sidewall 115 of the second through hole 105 and the outer surface 102 forms an arc chamfer 125. Radiuses of curvature of the two arc chamfers 124 and radiuses of curvature of the two arc chamfers 125 are the same. For simple illustration, the two arc chamfers 124 and the two arc chamfers 125 are collectively named as third arc chamfers, i.e. the third arc chamfers 124, 125 are formed between the first through hole 104 and the second through hole 105, the inner surface 101, and the outer surface 102. The third arc chamfer has a radius of curvature equal to the radius of curvature of the first arc chamfer 113.

In a manufacturing process of the glass housing, a hardening treatment may be performed to one of the inner surface 101 and the outer surface 102, such that the inner surface 101 or the outer surface 102 has a compressive stress layer. Generally, in the machining process of the glass, edges of a surface of the glass may inevitably generate micro-cracks. The micro-cracks can radically decrease the strength of the glass. A size of the micro-crack may be decreased by physical machining such as polishing, but a further chemical hardening treatment may obtain a better effect. For example, under a predetermined temperature, the glass may be immersed into a molten salt, the alkali metal ions in the glass may be exchanged with the alkali metal ions in the molten salt, thereby a compressive stress layer having a predetermined thickness is formed on the surface of the glass, thus the compressive stress layer is not an stratified structure additionally attached to the surface, but a strengthening layer formed from the surface of the glass inwardly within a predetermined thickness. The compressive stress layer causes the cracks not to expand, and thereby improving the strength of the glass.

In an alternative embodiment, after a first hardening treatment, the obtained compressive stress layer has a thickness ranging from 50 μm to 100 μm, the compressive stress layer has a compressive stress ranging from 200 Mpa to 300 Mpa. A central tensional stress between the inner surface and the outer surface is less than or equal to 100 Mpa.

In an alternative embodiment, after a second hardening treatment, the obtained compressive stress layer has a thickness ranging from 60 μm to 69 μm, i.e. in the second hardening treatment, the depth of the ion exchange is less than the depth of the ion exchange in the first hardening treatment. The compressive stress layer has a compressive stress ranging from 710 Mpa to 850 Mpa. A central tensional stress between the inner surface and the outer surface is less than or equal to 160 Mpa. By multiple hardening treatments, the compressive stress of the surface can be enhanced, and the strength of the glass is thereby improved. However, when the compressive stress of the surface is increased, the central tensional stress is also increased, if the central tensional stress is excessively increased, the glass may crack from an inner side toward outside and causes a spontaneous explosion. Therefore, the central tensional stress should be controlled, that is, the compressive stress cannot be increased without a limit.

In an alternative embodiment, at least one of the inner surface 101 and the outer surface 102 is provided with an attached decorative layer. The decorative layer can be formed by tinting the glass housing, enabling the housing to have an attractive appearance. The decorative layer can be formed on the inner surface 101 and/or the outer surface 102 by ink printing or laminating a decorative film. When the decorative layer is formed by ink printing, the ink layer has a thickness ranging from 5 μm to 40 μm. When the decorative layer is formed by laminating a decorative film, the decorative film has a thickness ranging from 10 μm to 125 μm. The decorative layer may be formed by silk-screening an explosion-proof membrane, and can also be formed by directly silk-screening the surface of a glue layer without a substrate.

In an alternative embodiment, at least one of the inner surface and the outer surface is attached by an antireflection layer. The antireflection layer can be formed by evaporation or sputtering.

In an alternative embodiment, the outer surface 102 is attached by an anti-fingerprint layer. The anti-fingerprint layer has an initial water droplet contact angle which is greater than or equal to 110°. The so-called water droplet contact angle is an angle defined by the gas-liquid phase interface and the solid-liquid phase interface, which are located at the solid-liquid-gas three phases interfaces. The water droplet contact angle is greater, the anti-fingerprint layer has a better hydrophobicity and a better anti-fouling performance. The initial water droplet contact angle is detected under the conditions that the formed anti-fingerprint layer is not used and not destroyed. The water droplet contact angle will decrease accompanying to a prolonging of the forming time and an increase of the wearing degree of the anti-fingerprint layer.

By aforementioned configuration of the structural parameters, the concentrated stress applied to the glass housing is dispersed, an integral strength of the glass housing is enhanced. The risk that cracks emerge easily by a slight collision due to the concentrated stress is reduced.

Figure 7:
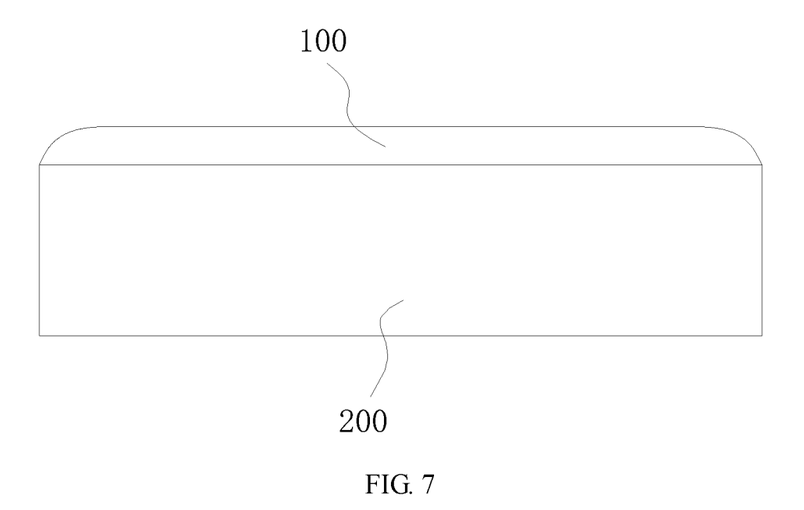
FIG. 7 is an end view of an electronic device having a glass housing.

The present disclosure further provides an electronic device having aforementioned glass housing. The electronic device can be a smart phone, a smart watch, and so on. Referring to FIG. 7, in an embodiment, for example, the electronic device includes a communicating main body 200 and a glass housing 100 assembled to the communicating main body 200.

Figure 8:
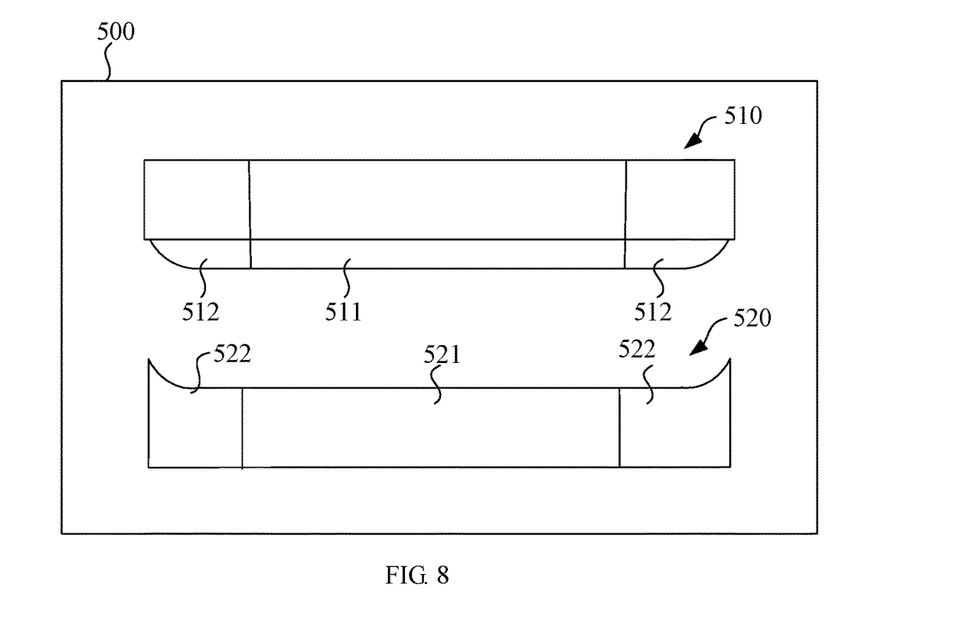
FIG. 8 is a perspective view of a manufacturing equipment of manufacturing the glass housing according to an embodiment.

The present disclosure further provides a manufacturing equipment of manufacturing aforementioned glass housing. As shown in FIG. 8, the manufacturing equipment is configured to press and bend a sub-slice glass obtained by punching a master-slice glass, opposite edges of the upper/lower surface of the sub-slice glass are allowed to form a curved portion, and the middle portion of the surface is also flat and forms the planar portion. The manufacturing equipment includes a sealing chamber 500, an upper die 510 and a lower die 520 which are located in the sealing chamber 500.

A relative movement between the upper die 510 and the lower die 520 will bend and deform the sub-slice glass which is located between the upper die 510 and the lower die 520. When bending, the sub-slice glass needs to be heated, and a heating process is preformed under a protective gas atmosphere. The sealing chamber 500 can secure a heating efficiency, and maintains a protective gas atmosphere, for example, the sealing chamber 500 is filled with nitrogen. The upper die 510 and the lower die 520 can be made of heat-resisting materials, such as the graphite material or the ceramic materials, and so on.

The upper die 510 includes an upper flat press portion 511 and an upper curved portion 512 separated from the upper flat press portion 511. Because the upper curved portion 512 is separated from the upper flat press portion 511, the upper flat press portion 511 and the upper curved portion 512 can be separately controlled, and move independently. The upper flat press portion 511 seamlessly matches the upper curved portion 512, i.e. the upper flat press portion 511 and the upper curved portion 512 form a continuous press surface which acts on the sub-slice glass. Similarly, the lower die 520 includes a lower flat press portion 521 and a lower curved portion 522 separated from the lower flat press portion 521. In a similar way, the lower curved portion 522 is separated from the lower flat press portion 521, thus the lower flat press portion 521 and the lower curved portion 522 can be separately controlled, and move independently. The lower flat press portion 521 seamlessly matches the lower curved portion 522, i.e. the lower flat press portion 521 and the lower curved portion 522 form a continuous press surface which acts on the sub-slice glass.

The upper flat press portion 511 and the lower flat press portion 521 are configured to clamp the planar portion of the glass housing of the electronic device. The upper curved portion 512 and the lower curved portion 522 have arc surfaces facing each other, and the arc surface has a radius of curvature ranging from 1 mm to 50 mm. In an alternative embodiment, the radius of curvature ranges from 5 mm to 50 mm. Further, the radius of curvature ranges from 5 mm to 20 mm. Moreover, the radius of curvature ranges from 5 mm to 10 mm. The upper curved portion 512 engages the lower curved portion 522 to form the curved portion of the glass housing.

When the manufacturing equipment is adopted to press and bend the sub-slice glass, firstly, the upper flat press portion 511 and the lower flat press portion 521 are controlled to move toward each other, causing the upper flat press portion 511 and the lower flat press portion 521 to firmly clamp the sub-slice glass, the clamped portion corresponds to the planar portion of the glass housing. When the sub-slice glass is fixed and aligned accurately, the upper curved portion 512 and the lower curved portion 522 move toward each other, to extrude opposite edges of the sub-slice glass. The upper curved portion 512 and the lower curved portion 522 have arc surfaces, thus opposite edges of the sub-slice glass form arc surfaces having corresponding radius of curvature, i.e. the curved portion of aforementioned glass housing is formed.

The upper curved portion 512 includes two upper curved sub-portions located on opposite edges of the upper curved portion 511. The two upper curved sub-portions can be independently arranged, for example, the two upper curved sub-portions can be synchronously driven by different driving sources. The two upper curved sub-portions can be connected by a connector, such that the two upper curved sub-portions can be driven by one driving source. The lower curved portion 522 includes two lower curved sub-portions located on opposite edges of the lower curved portion 521. The two upper curved sub-portions can be independently arranged, and the two upper curved sub-portions can also be synchronously driven by different driving sources. Obviously, the two upper curved sub-portions can be connected by a connector.

By an independent arrangement of the flat press portion and the curved portion, micro-cracks generated by an excess stress on the integral glass can thereby be avoided, such that a yield can be improved and a strength of the glass can be enhanced.

Further, the upper flat press portion 511 and the lower flat press portion 521 are arranged without a heating source, the upper flat press portion 511 and the lower flat press portion 521 merely clamp the sub-slice glass. The upper curved portion 512 and/or the lower upper curved portion 512 are provided with a heating source, for heating opposite edges of the sub-slice glass. The heating method can be heat conduction or thermal radiation. For example, the heating source is utilized to perform an accurate thermal radiation to corresponding portions of the sub-slice glass. By such a configuration, when a heat and a press are performed to the integral sub-slice glass, the deformation defect which emerges easily on the middle portion of the sub-slice glass can be avoided.

Figure 9:
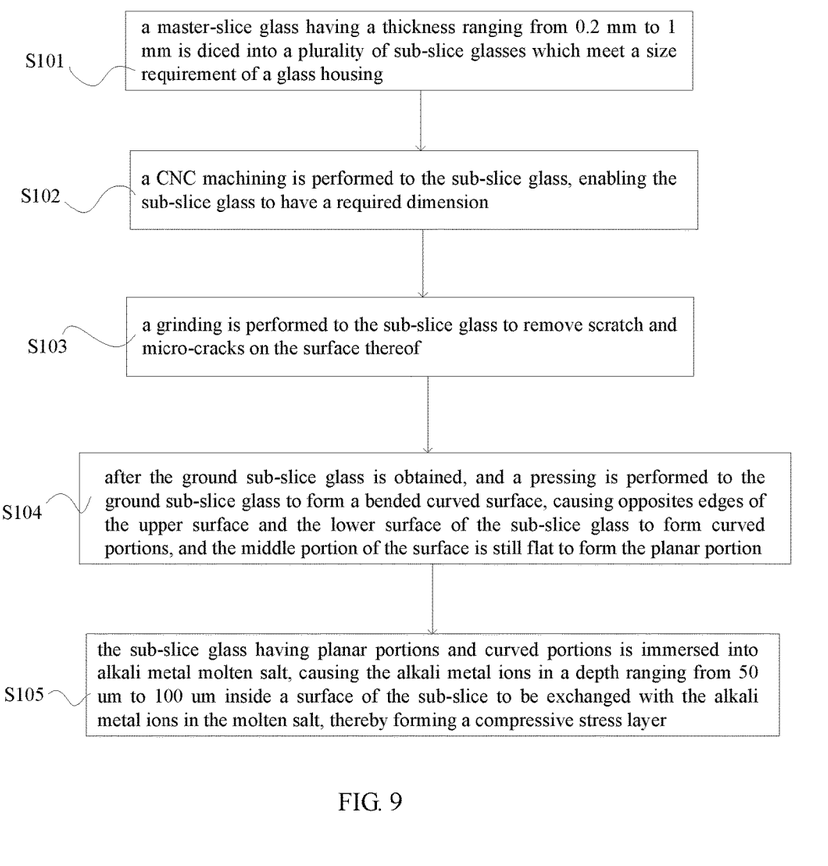
FIG. 9 is a flow chart of a manufacturing method of a glass housing.

Referring to FIG. 9, the present disclosure further provides a manufacturing method of aforementioned glass housing. The manufacturing method includes the following steps:

In step S101: a master-slice glass having a thickness ranging from 0.2 mm to 1 mm is diced into a plurality of sub-slice glasses which meet a size requirement of a glass housing. A size of the master-slice glass can be determined according to efficiency and technology. The cutting can be performed by a tool made of metal or by a laser, and so on. In an alternative embodiment, in the cutting process, the following steps are further included: the master-slice glass is punched to form a first through hole and a second through hole.

In step S102: a CNC machining is performed to the sub-slice glass, enabling the sub-slice glass to have a required dimension.

In step S103: a grinding is performed to the sub-slice glass to remove scratch and micro-cracks on the surface thereof. The CNC machining creates scratch and generates micro-cracks on the machined surface of the sub-slice glass inevitably. By grinding, some great cracks can be eliminated, causing the cracks not to expand.

In step S104: after the ground sub-slice glass is obtained, and a pressing is performed to the ground sub-slice glass to form a bended curved surface, causing opposites edges of the upper surface and the lower surface of the sub-slice glass to form curved portions, and the middle portion of the surface is still flat to form the planar portion. Specifically, the sub-slice glass is heated up to a temperature of 690±10° C. Under a nitrogen environment, a hot bending is performed to the sub-slice glass, a pressure of the hot bending is 0.14±0.05 MPa, a duration time of the hot bending is 2±0.5 min. At the time, the glass housing is preliminary formed, and has an inner surface, an outer surface, and a circumferential surface. Each of the inner surface and the outer surface has a planar portion and two curved portions located on opposite edges of the planar portion. The curved portion is an arc surface, and a radius of curvature of the arc surface ranges from 1 mm to 50 mm. In an embodiment, the radius of curvature ranges from 5 mm to 50 mm. In an alternative embodiment, the the radius of curvature ranges from 5 mm to 20 mm. Further, the radius of curvature ranges from 5 mm to 10 mm. When pressing, the planar portions and the curved portions can be formed by a multistep pressing method. That is, firstly, the middle portion of the sub-slice glass is clamped and positioned by the flat press portion of the pressing equipment provided by aforementioned embodiment, opposite edges of the sub-slice glass is extruded and bended by the separated curved portions to form the curved portion. When extruding, the curved portion completely contacts the edges of the sub-slice glass, causing the edges of the sub-slice to form an arc surface corresponding to the curved portion.

The upper die and the lower die can be equipped with a heating source to perform a heating to the middle portion and opposite edges of the sub-slice glass, or a heating is performed to the integral sub-slice glass by an accurate radiation. Further, when pressing, the middle portion of the sub-slice glass is clamped and the sub-slice glass is positioned without heating, and then opposite edges of the sub-slice glass is extruded and bended under a heating process. Because only the edges are heated, the deformation defect of the middle portion can be avoided when the integral sub-slide glass is pressed.

In step S105: the sub-slice glass having planar portions and curved portions is immersed into alkali metal molten salt, causing the alkali metal ions in a depth ranging from 50 μm to 100 μm inside a surface of the sub-slice to be exchanged with the alkali metal ions in the molten salt, thereby forming a compressive stress layer. By the strengthening treatment, the compressive stress layer has a compressive stress ranging from 200 Mpa to 300 Mpa, and a central tensional stress between the inner surface and the outer surface is less than or equal to 100 Mpa.

In an alternative embodiment, a second hardening treatment is provided, the compressive stress layer has a thickness ranging from 60 μm to 69 μm, i.e. in the second hardening treatment, the depth of the ion exchange is less than the depth of the ion exchange in the first hardening treatment. The compressive stress layer has a compressive stress ranging from 710 Mpa to 850 Mpa. The central tensional stress between the inner surface and the outer surface is less than or equal to 160 Mpa. By multiple hardening treatments, the compressive stress of the surface can be enhanced, and the strength of the glass is thereby improved.

In an alternative embodiment, after the pressing step and prior to the strengthening step, a polishing step is provided, which includes polishing connecting portions of adjacent surfaces to form arc chamfers. For example, connecting portions which join the inner surface, the outer surface, and the circumferential surface forms arc chamfers, connecting portions which join the first through hole, the second hole, the inner surface, and the outer surface forms arc chamfers.

In an alternative embodiment, after the strengthening step, a surface decoration step is provided. The surface decoration step includes forming a decorative layer, an anti-fingerprint layer or an antireflection layer on the surface of the sub-slice glass. The decorative layer can be formed by tinting the glass housing, enabling the housing to have a more attractive appearance. The decorative layer can further serve as a functional layer shielding the built-in elements within the electronic device. The decorative layer can be formed on the inner surface and/or the outer surface by ink printing or laminating. When the decorative layer is formed by ink printing, the ink layer has a thickness ranging from 5 μm to 40 μm. When the decorative layer is formed by laminating a decorative film, the decorative film has a thickness ranging from 10 μm to 125 μm. The decorative film may be formed by silk-screening an explosion-proof membrane, and can also be formed by directly silk-screening the surface of a glue layer without a substrate. The antireflection layer can be formed on the inner surface and/or on the outer surface by evaporation, sputtering, and so on.

Technical features of above embodiments can be combined arbitrary, for simple, any combination of every technical feature in above embodiments is not all illustrated. However, the technical features which are not contradicted to each other may fall into the scope of the specification.

The above are several embodiments of the present invention described in detail, and should not be deemed as limitations to the scope of the present invention. It should be noted that variations and improvements will become apparent to those skilled in the art to which the present invention pertains without departing from its spirit and scope. Therefore, the scope of the present invention is defined by the appended claims.

What is claimed is:

1. A glass housing, comprising:
    an inner surface;
    an outer surface opposite to the inner surface; and
    a circumferential surface interconnecting the outer surface and the inner surface, wherein a distance between the inner surface and the outer surface ranges from 0.2 mm to 1 mm, each of the inner surface and the outer surface comprises a planar portion and two curved portions extending outwardly from opposite edges of the planar portion towards a side thereof, the two curved portions having an arc surface having a radius of curvature ranging from 5 mm to 50 mm,
    wherein a first arc chamfer is formed between the inner surface and the circumferential surface, and a second arc chamfer is formed between the outer surface and the circumferential surface, a radius of curvature of the second arc chamfer is twice of a radius curvature of the first arc chamfer.

2. The glass housing according to claim 1, wherein the curved portion has a radius of curvature ranging from 5 mm to 20 mm.

3. The glass housing according to claim 1, wherein the curved portion has a radius of curvature ranging from 5 mm to 10 mm.

4. The glass housing according to claim 1, further comprising at least one of the following layers:
    an antireflection layer attached to at least one of the inner surface and the outer surface;
    an anti-fingerprint layer attached to the outer surface and having an initial water droplet contact angle which is greater than or equal to 110°; and
    a decorative layer attached to the inner surface.

5. The glass housing according to claim 1, further comprising a decorative layer attached to the inner surface, wherein the decorative layer is formed by ink printing, the decorative layer has a thickness ranging from 5 μm to 40 μm; or the decorative layer is formed by laminating a decorative film, the decorative film has a thickness ranging from 10 μm to 125 μm.

6. The glass housing according to claim 1, further defining a first through hole and a second through hole which extending through the inner surface and the outer surface, wherein the inner surface and the outer surface each has a central axis, orthographic projection of a geometric center of the first through hole and orthographic projection of a geometric center of the second through hole fall on the central axis of the inner surface or the outer surface.

7. The glass housing according to claim 1, wherein third arc chamfers are formed between the first through hole and the second through hole, the inner surface, and the outer surface, a radius of curvature the third arc chamfer is equal to the radius of curvature of the first arc chamfer.

8. A manufacturing equipment of manufacturing a glass housing having a first arc chamfer between an inner surface and a circumferential surface, and a second arc chamfer between an outer surface and the circumferential surface, wherein a radius of curvature of the second arc chamfer is twice of a radius curvature of the first arc chamfer, comprising:
    a sealing chamber; and
    an upper die and a lower die located in the sealing chamber, wherein the upper die comprises an upper flat press portion and an upper curved portion separated from the upper flat press portion, the lower die comprises a lower flat press portion and a lower curved portion separated from the lower flat press portion, the upper flat press portion and the lower flat press portion are configured to clamp a planar portion of the glass housing, the upper curved portion and the lower curved portion have arc surfaces facing each other, and the arc surfaces have has a radius of curvature ranging from 1 mm to 50 mm, the upper curved portion engages the lower curved portion to form a curved portion of the glass housing.

9. The manufacturing equipment according to claim 8, wherein the upper curved portion comprises two upper curved sub-portions located on opposite edges of the upper curved portion, the two upper curved sub-portions are independently arranged, or connected by a connector, the lower curved portion comprises two lower curved sub-portions located on opposite edges of the lower curved portion, the two upper curved sub-portions are independently arranged or connected by another connector.

10. The manufacturing equipment according to claim 8, wherein the upper curved portion and/or the lower curved portion is equipped with a heating source.

11. A method of manufacturing a glass housing having a first arc chamfer between an inner surface and a circumferential surface, and a second arc chamfer between an outer surface and the circumferential surface, wherein a radius of curvature of the second arc chamfer is twice of a radius curvature of the first arc chamfer, comprising:
   dicing a master-slice glass having a thickness ranging from 0.2 mm to 1 mm into a plurality of sub-slice glasses which meet a size requirement of a glass housing;
   performing a CNC machining to the sub-slice glass, enabling the sub-slice glass to have a required dimension;
   grinding the machined sub-slice glass to remove scratch and micro-cracks on a surface thereof;
   clamping and positioning a middle portion of the sub-slice glass, and pressing and bending opposite edges of the sub-slice glass to form arc surfaces, the arc surfaces having a radius of curvature ranging from 5 mm to 50 mm; and
   immersing the pressed sub-slice glass into alkali metal molten salt to form a compressive stress layer on the sub-slice glass.

12. The method according to claim 11, wherein the dicing the master-slice glass further comprises: punching the master-slice glass to form a first through hole and a second through hole.

13. The method according to claim 12, further comprising polishing step after pressing and bending opposite edges of the sub-slice glass, wherein the polishing step comprises polishing connecting portions of adjacent surfaces of the sub-slice glass to form arc chamfers.

14. The method according to claim 12, further comprising a surface decoration step after immersing the pressed sub-slice glass into alkali metal molten salt, wherein the surface decoration step comprises forming a decorative layer, an anti-fingerprint layer, or an antireflection layer on the surface of the sub-slice glass.

15. The method according to claim 11, wherein in the step of pressing and bending opposite edges of the sub-slice glass to form arc surfaces, the sub-slice glass is heated up to a temperature of 690±10° C., under a nitrogen environment, a hot bending is performed to the sub-slice glass, a pressure of the hot bending is 0.14±0.05 MPa, a duration time of the hot bending is 2±0.5 min.

16. The method according to claim 11, wherein in the step of pressing and bending opposite edges of the sub-slice glass to form arc surfaces, the middle portion of the sub-slice glass is clamped without heating, and then opposite edges of the sub-slice glass is extruded and bended under a heating process.

17. The method according to claim 11, wherein in the step of pressing and bending opposite edges of the sub-slice glass to form arc surfaces, the middle portion and opposite edges of the sub-slice glass are heated at the same time, and opposite edges of the sub-slice glass is extruded and bended.

18. The glass housing according to claim 1, further comprising:
   at least one comprehensive stress layer being formed by at least one chemical hardening treatment, within at least one of the inner surface or the outer surface of the glass housing.

19. The glass housing according to claim 18, wherein, in the at least one chemical hardening treatment, a first plurality of alkali metal ions in the glass housing are exchanged with a second plurality of alkali metal ions in the molten salt.

20. The glass housing according to claim 18, wherein the at least one comprehensive stress layer improves the glass housing's strength.

* * * * *